(12) United States Patent
Mohan et al.

(10) Patent No.: US 7,359,303 B2
(45) Date of Patent: Apr. 15, 2008

(54) MULTI-DIMENSIONAL CODING FOR HIGH-DENSITY STORAGE MEDIA APPLICATIONS

(75) Inventors: Chandra Mohan, Carmel, IN (US); James Zhiming Zhang, Carmel, IN (US)

(73) Assignee: Thomson Licensing, Boulogne Billancourt (FR)

(*) Notice: Subject to any disclaimer, the term of this patent is extended or adjusted under 35 U.S.C. 154(b) by 542 days.

(21) Appl. No.: 10/535,319

(22) PCT Filed: Nov. 14, 2003

(86) PCT No.: PCT/US03/36575

§ 371 (c)(1),
(2), (4) Date: May 18, 2005

(87) PCT Pub. No.: WO2004/047085

PCT Pub. Date: Jun. 3, 2004

(65) Prior Publication Data

US 2006/0050427 A1    Mar. 9, 2006

Related U.S. Application Data

(60) Provisional application No. 60/427,817, filed on Nov. 20, 2002.

(51) Int. Cl.
*G11B 5/09* (2006.01)

(52) U.S. Cl. .................. 369/59.13; 369/59.23; 369/59.1; 369/47.1

(58) Field of Classification Search .............. None
See application file for complete search history.

(56) References Cited

U.S. PATENT DOCUMENTS

| 5,490,091 A | 2/1996 | Kogan et al. |
| 6,055,119 A | 4/2000 | Lee |
| 6,359,525 B1 | 3/2002 | Mohan et al. |

FOREIGN PATENT DOCUMENTS

| EP | 0044073 | 7/1981 |
| WO | WO 99/46861 | 9/1999 |

OTHER PUBLICATIONS

Search Report Dated Mar. 16, 2004.

*Primary Examiner*—Muhammad Edun
(74) *Attorney, Agent, or Firm*—Joseph J. Laks; Robert B. Levy; Jeffrey D. Hale

(57) ABSTRACT

An asynchronous transfer mode digital document delivery system is provided. A customer premise unit is configured to permit a customer to order and receive a data stream. A buffer is coupled to the customer premise unit to store the data stream before transmitting the data stream to a customer. A server includes digital documents stored thereon for delivery to customers through a switched ATM network. A control mechanism is employed to control a data rate of the data stream between the server and the buffer to ensure maintenance of a steady data stream from the customer premise unit to a customer during a loss of a physical layer between the server and the customer premise unit.

16 Claims, 9 Drawing Sheets

MULTI-DIMENSIONAL CODING FOR HIGH-DENSITY STORAGE MEDIA APPLICATIONS

This application claims the benefit, under 35 U.S.C. § 365 of International Application PCT/US03/36575, filed Nov. 14, 2003, which was published in accordance with PCT Article 21(2) on Jun. 3, 2004 in English and which claims the benefit of U.S. provisional patent application No. 60/427,817, filed Nov. 20, 2002.

BACKGROUND OF THE INVENTION

1. Field of the Invention

The present invention generally relates to signal coding and, more particularly, to multi-dimensional coding for high-density storage media applications.

2. Background of the Invention

Even though already a multi-billion dollar industry, the digital recording industry is expected to expand further in the future as an almost insatiable appetite for more storage continues to grow. This increase is partly fueled by the steady move towards digital systems, as has happened for example in the audio industry with the replacement of the analog Long Play (LP) disk by the digital Compact Disk (CD). Digital disk recording systems include magnetic and optical recording, the latter mainly for read only applications. Whether optical or magnetic, one of the main goals of ongoing research is to increase areal density in bits per unit area.

Modulation codes, for most recording systems, focus on increasing linear density through the reduction of Inter-Symbol Interference (ISI). Further increases in storage density are potentially available by reducing track width and increasing track density. However, this results in undesirable Inter-Track Interference (ITI) and a reduction in signal-to-noise ratio (SNR). Consequently, typical magnetic recording systems have linear-to-track density ratios of only 25 to 1. Head misalignment or side reading (cross talk) that occurs between the read head and adjacent track data causes ITI. This has been acknowledged as an important noise source that can be alleviated by employing sophisticated signal processing techniques whilst reading several adjacent tracks simultaneously with a multi-track head. An additional advantage of reading multiple tracks in parallel can be gained by employing two-dimensional run-length limited (d, k) modulation codes. These have attracted much attention in recent years as a means of increasing storage capacity by relaxing the timing constraint, k, along the tracks. Timing recovery is then achieved in a joint manner from information taken across a number of tracks.

Currently, the storage capacity of media such as, for example, a Hard Disk Drive (HDD) or an optical drive is limited by the state of the art of head, media and write technology. Contiguous media provides the best opportunity to increase storage space using the best cost metrics. One of the vexing problems in media storage is the inability of magnetic media to handle transition flux changes in excess of 500-800 Kbpi due to overwrite issues.

Coding and other methods and apparatus have been proposed to reduce the number of such transitions. However, all of such existing approaches suffer from one or more deficiencies. For example, transition detection is performed by peak detection methods that employ Analog-to-Digital Converters (ADCs), thereby increasing power consumption, which is not ideal for Microdrive and other portable media applications. Further, there is significant room for improvement in the current capacities of 1.3 bits per transition.

Multi head and multi track combinations along with the new perpendicular recording techniques have been used to increase the capacity of storage mediums. These approaches are expensive and generally will suffer from reliability issues due to the increased number of heads as well as the characteristics of the new media used in the perpendicular recording system.

Accordingly, it would be desirable and highly advantageous to have a coding method and apparatus for high-density storage media applications that overcome the above-described deficiencies of the prior art.

SUMMARY OF THE INVENTION

The problems stated above, as well as other related problems of the prior art, are solved by the present invention, which is directed to a multi-dimensional coding method and apparatus for high-density storage media applications.

According to an aspect of the present invention, there is provided a method for encoding a random bit stream in two-dimensions for storage on a storage medium. The random bit stream is encoded using Variable Aperture Coding (VAC) so as to generate a constant amplitude, varying pulse-width, VAC encoding that represents the random bit stream by a plurality of pulses separated using only transition widths included in a pre-specified set of transition widths.

According to another aspect of the present invention, there is provided a method for storing a random bit-stream on a storage medium. The random bit stream is represented by a constant amplitude, varying pulse-width, VAC encoding having a plurality of pulses that are separated using only transition widths included in a pre-specified set of transition widths. The VAC encoding is transmitted along a data channel for storage on the storage medium.

These and other aspects, features and advantages of the present invention will become apparent from the following detailed description of preferred embodiments, which is to be read in connection with the accompanying drawings.

DETAILED DESCRIPTION OF THE INVENTION

Figure 1:
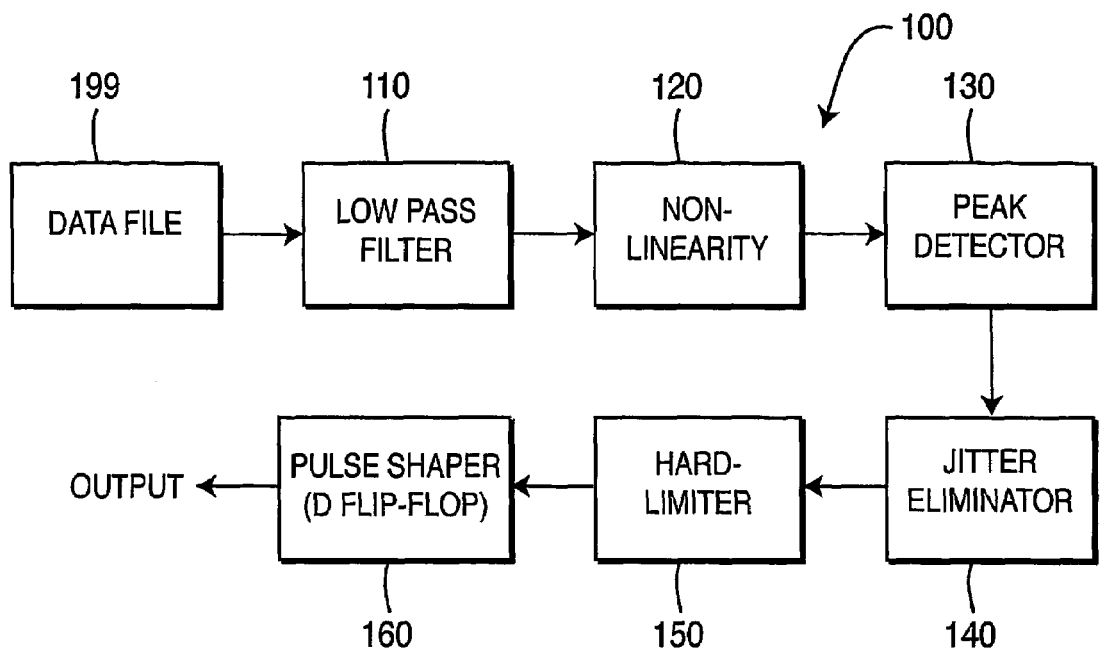
FIG. 1 is a block diagram illustrating a detector/decoder circuit 100 for Variable Aperture Coding (VAC), according to an illustrative embodiment of the present invention.

The present invention is directed to a multi-dimensional coding method and apparatus for high-density storage media applications. The present invention provides a method and apparatus for coding that utilizes multiple dimensions (widths) to reduce the number of flux transitions. The Variable Aperture Coding (VAC) based channel is different from the existing Partial Response Maximum Likelihood (PRML) channels in that the VAC encoding is performed to represent 2-8 distinctive transition points with variable T spacings, thereby avoiding Inter-Symbol Interference (ISI) related issues. The current capacities of 1.3 bits per transition can be progressively improved to 4 bits per transition, allowing tremendous improvement in storage density. Further, as the detection is performed by peak detection methods without Analog-to-Digital Converters (ADCs), VAC based Hard Disk Drives (HDD) will have lower power consumption, making them ideal for Microdrive and other portable media applications.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Variable Aperture coding is a new class of Digital Bi-Phase coding that can drastically reduce the bandwidth efficiency (bits/sec/hertz) for any random digital bit stream. If "R" is the rate of the information signal, the VAC coding method does not reduce transition density as is the case with most of the higher order modulation schemes like Orthogonal Frequency Division Multiplexing (OFDM), Quadrature Amplitude Modulation (L-QAM) or Multiple Phase Shift Keying (MPSK) but rather compresses the power spectral density to be highly concentrated within a bandwidth of R/9 times the bit rate. A non-VAC encoding method would have required at least a bandwidth of "R" to successfully decode the signal. Due to the narrow occupied bandwidth of the VAC signal, capacity increase in storage is possible through the introduction of di-bit encoded VAC that increases capacity two-fold and/or having an orthogonal VAC bit stream introduced in the interval between the transitions. In order to increase the Tracks per inch, alternate tracks can be run on orthogonal VAC streams. There is also the possibility of reducing the inter-track distances due to reduced Inter-Track Interference (ITI) derived out of the signal orthogonality in adjacent tracks as well as due to the narrow Power Spectral Density (PSD) foot print that leads to lesser leakage into adjacent write domains. Since Longitudinal Recording/Optical recording is a 2-dimensional embedding process, and assuming spindle speeds to be constant, it is not possible to increase capacity without adding additional dimensions to the signal either in space or time. Perpendicular recording increases capacity by providing an additional dimension in space, where as VAC provides the added dimensions by altering the time domain. Consequently, VAC symbols will vary in width, which will in turn represent the various signal transitions in the original data stream.

Using an efficient encoding and modulation method is yet another approach for improving the Areal density, an area that has not been extensively researched by any of the leading research groups. Although Extended Partial Response Maximum Likelihood (EPRML) and its derivatives have been adopted by the HDD industry as a standard, functionally, EPRML only enables the imprinting of a transition on a magnetic material with a smallest repeatable footprint, besides reducing the number of transitions in the magnetic media. However, using PRML, the closest transition could still occur at a distance of 1T and this poses limitations with respect to ISI and ITI related issues. PRML combined with VAC reduces the transition density, while improving the number of bits per transition over a pure PRML encoded channel. Given the current state of art media and head technologies, it is possible to increase capacity by assigning "multi bit weightage" for every transition.

VAC was originally designed to minimize transmission bandwidth in digital communication applications. The present invention is directed to the use of VAC to help increase storage capacity in the HDD and other storage industries.

The way 1s and 0s are stored on the disk to mark the duration of the original data from one transition to the next is to record a transition pulse on the disk. The distance (can be translated to time duration as it is presumed that the disk is spinning at a constant spend) between transitions is that bit's duration of the incoming signal. This is really a simple and direct way to write on the disk. However, the duration differences of successive transitions vary so much (also in a random fashion) that they create Inter-Symbol Interference such that the read process becomes unreliable. Furthermore, as we increase the packing density, this Inter-Symbol Interference becomes a significant problem. Consequently, several encoding schemes were used to correct the read error due to the Inter-Symbol Interference and other problems associated with data recovery during the read operation. These coding schemes have the basic concept that a certain combination (or pattern) of 1s and 0s will help to minimize Inter-Symbol Interference. The process is based on some mathematic formula such that, for so many bits, the maximum number of consecutive 1s and 0s must meet a predetermine pattern. In most cases, additional 0s will be added to the input sequence to meet this coding requirement. As an example, a 1000 1s and 0s of an incoming signal become 1400 1s and 0s as they are being written onto the disk. This 40% increase in overhead is really not as bad as creating a redundant track to overcome the unreliable read operation.

PRML is another improvement for increasing storage capacity and read reliability. However, it is still dependent upon the channel coding scheme and, while the read reliability of PRML is much better than the peak detect method, the overhead is still there.

A description will now be given of experiments corresponding to and illustrating the present invention. The inventions were performed to verify the feasibility of VAC signal detection over a HDD channel with the impact of transition noise. Peak detection was employed to detect the transitions. Of course, other methods may also be employed while maintaining the spirit and scope of the present invention. The experiments were conducted at 50 Mbps symbol rate (2T). The inventions were further performed to investigate the impact of the aperture size on the detection of the VAC signal. It is expected that a VAC signal with wider apertures can be detected easier. Moreover, the inventions were performed such that the Peak detection of VAC as conducted without an Analog-to-Digital Converter (ADC) in the Read Channel.

The test was conducted in two main steps. First, experimental data taken from the HDD channel was used. The data patterns are to be "3-6-9", "4-6-8" and "5-6-7" which reflect the aperture change of the VAC coding. The symbols rate would be at 50 Mbps. Second, the experimental data was used as the input to the detector/decoder, and to show the feasibility of VAC signal detection.

The experimental data follows the following pattern: (1) 80 repetitions of 6T's were sent; (2) 200 repetitions of the desired data pattern (e.g. 3-6-9, or 4-6-8. etc.) were sent; and (3) 6T was with 300 MHz clock, 2 Gs/s acquisition rate, data truncated to 27 kb in size.

FIG. 1 is a block diagram illustrating a detector/decoder circuit 100 for Variable Aperture Coding (VAC), according to an illustrative embodiment of the present invention. The detector/decoder circuit 100 includes a low pass filter 110, a non-linearity module 120, a peak detector 130, a jitter eliminator 140, a hard-limiter 150, and a pulse-shaper 160.

The low pass filter 110 retains necessary information (e.g., data file 199) for signal reconstruction, and filters out noise, especially digital noise from data acquisition. The non-linearity module 120 applies a non-linearity to the output of the low pass filter. The amount of non-linearity applied was determined by simulation results. An appropriate amount of nonlinearity was applied to slim the filtered pulses. The peak detector 130 detects the peaks of the pre-processed signals. The jitter eliminator 140 eliminates the jitters between desired pulses to reduce errors. The hard-limiter 150 converts a detected signal into a "0-1" valued pulse train. The pulse shaper 160 converts the pulse train back to an original VAC rectangular waveform with varying widths.

Figure 2:
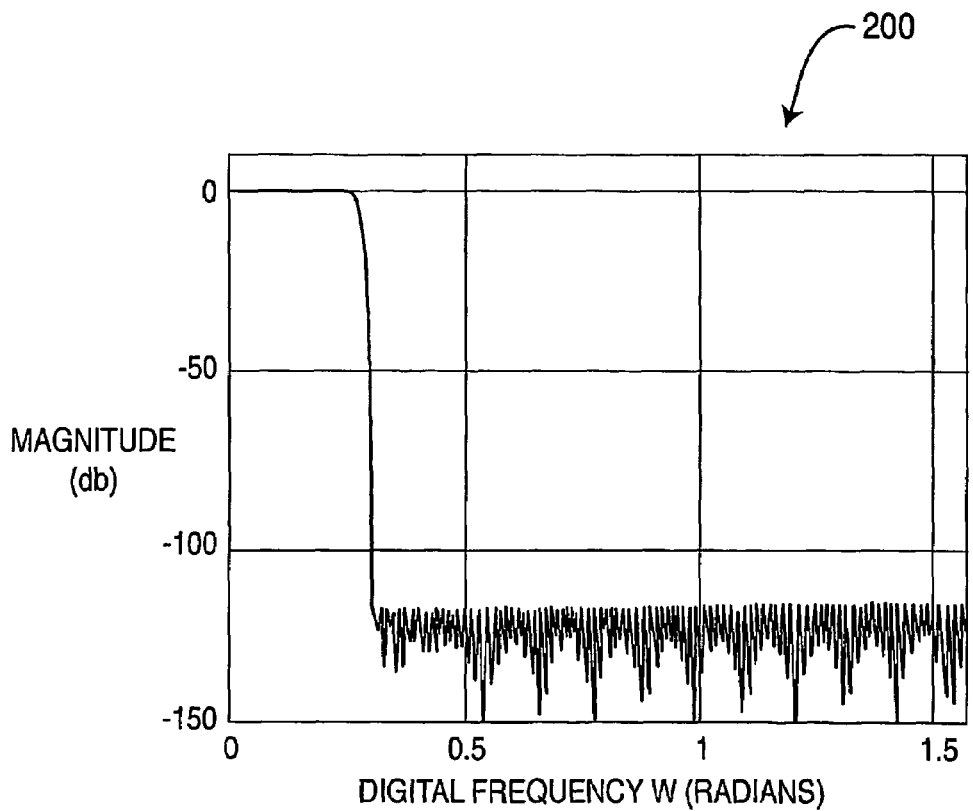
FIG. 2 is a diagram illustrating a characteristic 200 of the low pass filter 110 of FIG. 1, according to an illustrative embodiment of the present invention.

FIG. 2 is a diagram illustrating a characteristic 200 of the low pass filter 110 of FIG. 1, according to an illustrative embodiment of the present invention. It is worth noting that, to avoid confusion, all the frequencies are converted to digital frequencies between $-\pi$ to $\pi$. To convert them back to analog frequencies, it is necessary to know the data rate, clock rate, sampling rate, and any other frequency conversion rates that may be incurred during the experiment process.

It should also be noted that the low pass filter 110 is adjusted based on the input signal pattern. This is because different data patterns introduce different highest frequencies in the signals. The low pass filter 110 should be adjusted to accommodate the frequency changes.

A description will now be given of the test results corresponding to the above-described experiments.

Thus far, the "3-6-9" data pattern, the "4-6-8" pattern and the "5-6-7" pattern were successfully decoded. The simulation verified the following results: (1) the VAC signal is detectable under the conditions described above; and (2) the VAC signal with wider aperture is easier for detection.

A description will now be given of the detection of the 3-6-9 coding pattern, according to an illustrative embodiment of the present invention. The results of the detection of the 3-6-9 coding pattern are shown and described with respect to FIGS. 3-6.

Figure 3A:
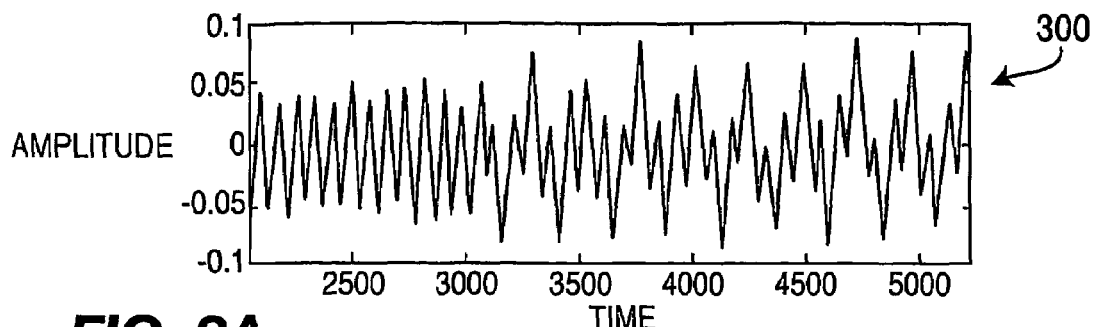
FIGS. 3A and 3B are diagrams respectively illustrating the acquired 3-6-9 data waveform 300 from a Hard Drive Disk (HDD) channel and the corresponding spectrum 350, according to an illustrative embodiment of the present invention.
Figure 3B:
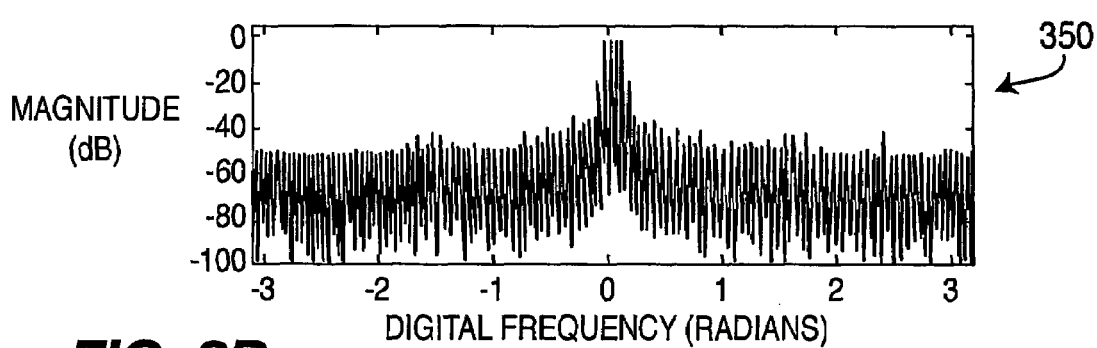

FIGS. 3A and 3B are diagrams respectively illustrating the acquired 3-6-9 data waveform 300 from a Hard Drive Disk (HDD) channel and the corresponding spectrum 350, according to an illustrative embodiment of the present invention. The first part of the waveform of FIG. 3A shows the repetition of 6Ts, and the later part of the waveform shows the "3-6-9" pattern. It can be observed that from both the waveform and the spectrum that the signal contains a lot of digital noise which, in turn, makes the signal hard to detect without any filtering.

Figure 4A:
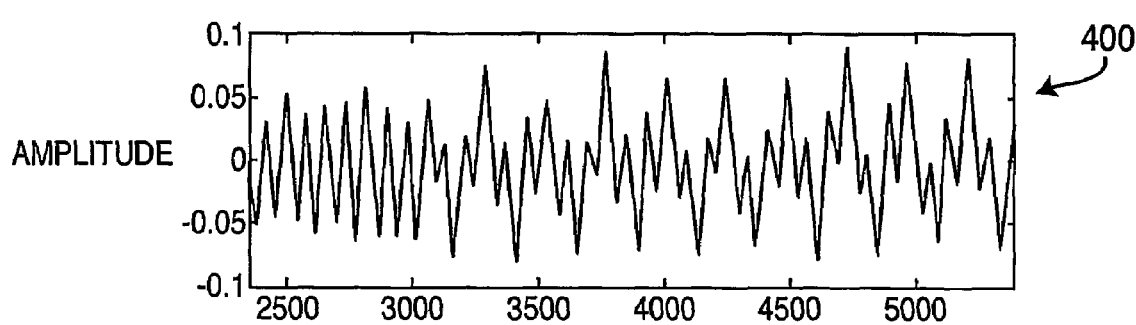
FIGS. 4A and 4B are diagrams respectively illustrating a filtered version 400 of the acquired 3-6-9 data waveform 300 of FIG. 3A after filtering and the corresponding spectrum 450, according to an illustrative embodiment of the present invention.
Figure 4B:
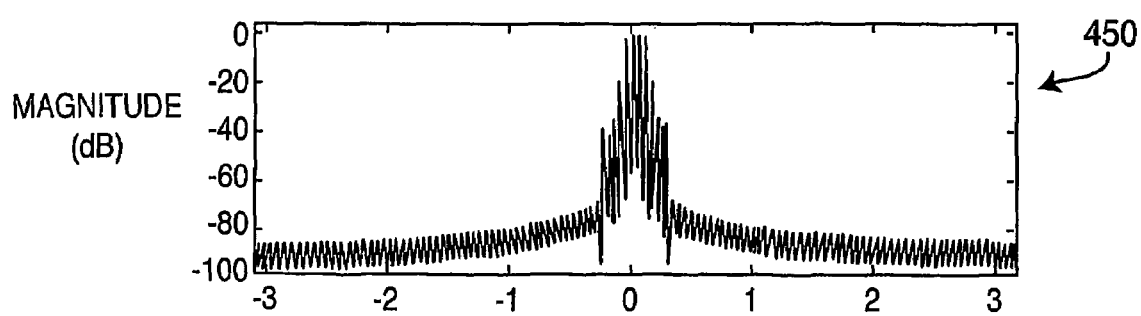

FIGS. 4A and 4B are diagrams respectively illustrating a filtered version 400 of the acquired 3-6-9 data waveform 300 of FIG. 3A after filtering and the corresponding spectrum 450, according to an illustrative embodiment of the present invention. It can be seen that the filtered signal 400 is much "cleaner" and it is better suited for peak detection. The waveform 400 shown in FIG. 4A is the signal 300 after processing by the low pass filter 110 and the non-linearity module 120 of FIG. 1.

Figure 5A:
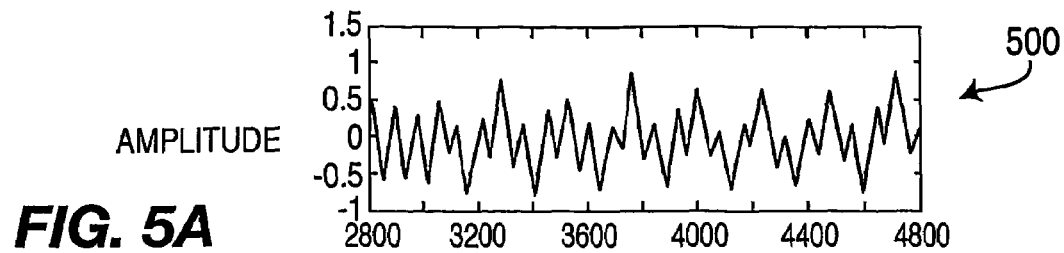
FIGS. 5A and 5B are diagrams respectively illustrating a jitter-eliminated and hard-limited version 500 of the filtered signal 400 of FIG. 4A and a jitter-eliminated and hard-limited version 550 of a peak detected signal, according to an illustrative embodiment of the present invention.
Figure 5B:
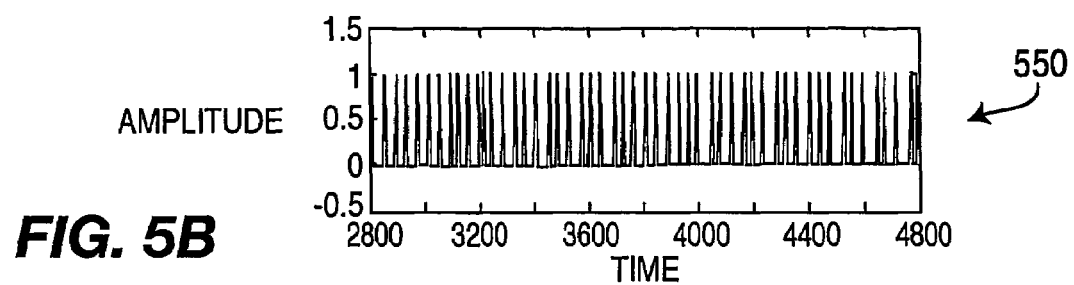

FIGS. 5A and 5B are diagrams respectively illustrating a jitter-eliminated and hard-limited version 500 of the filtered signal 400 of FIG. 4A and a jitter-eliminated and hard-limited version 550 of a peak detected signal, according to an illustrative embodiment of the present invention. It can be seen that the signal 550 shown in FIG. 5B faithfully represents the peaks of the original signal. It can also be observed that the widths between the pulses are different, but the distances match "3-6-9" pulse distances. The signals 500 and 550 have been processed by both the jitter eliminator 140 and the hard-limiter 150 of FIG. 1.

Figure 6A:
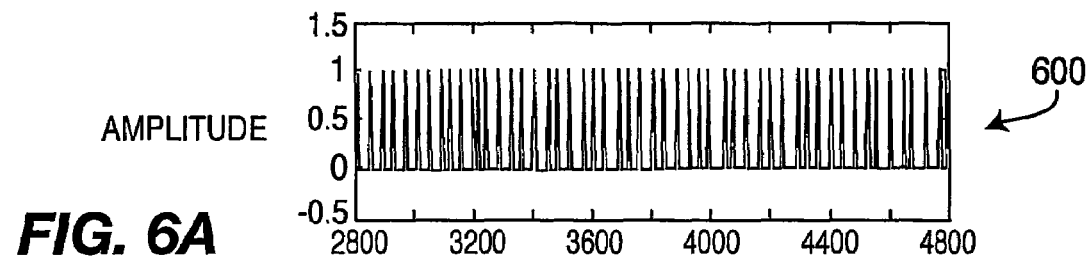
FIGS. 6A and 6B are diagrams respectfully illustrating a pulse-shaped version 600 of the peak-detected signal and a pulsed-shaped version 650 of the decoded signal, according to an illustrative embodiment of the present invention.
Figure 6B:
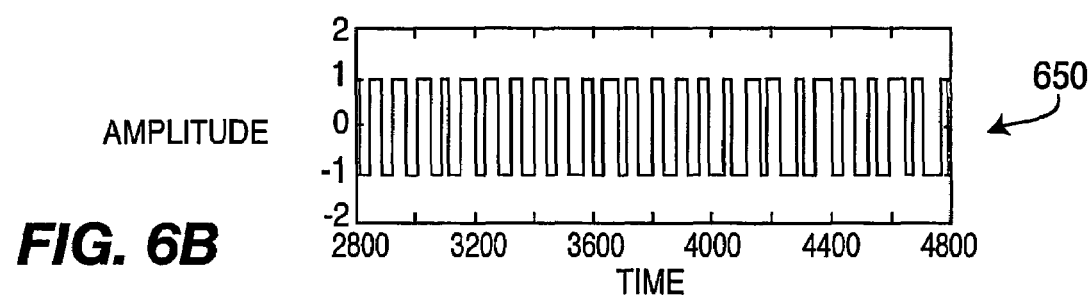

FIGS. 6A and 6B are diagrams respectfully illustrating a pulse-shaped version 600 of the peak-detected signal and a pulsed-shaped version 650 of the decoded signal, according to an illustrative embodiment of the present invention. The reconstructed (decoded) signal is a rectangular VAC signal whose transitions correspond to the detected pulses. Three distinctive widths can be observed in the reconstructed signal.

It should be noted that, depending on the sampling rate for detection, a detection window may be used to "pull" the transitions to the correct positions. For example, if the sampling rate is 5 samples/bit, then the following detection window can be used:

(1) If the number of counts between two pulses is less than 25 samples—a decision of "3T" is made (Note that a 3T has 15 samples, a margin of 10 samples is given to improve the performance;
(2) If the number of counts between two pulses is greater than 35 samples—a decision of "9T" is made (Note that 9T has 45 samples, a margin of 10 samples is given to improve the performance).
(3) If the number of counts is between 26 and 34 samples—a decision of "6T" is made (Note that 6T has 30 samples in it).

The error performance was conducted based on the concept described above. No errors were found in the detected signal. (Note: Errors occurred at the very first bit and some bits at the end of the sequence. However, these errors were caused during the data acquisition process and the filtering process, not by the detection method.

A description will now be given of the detection of the 4-6-8 coding pattern, according to an illustrative embodiment of the present invention. The results of the detection of the 4-6-8 coding pattern are shown and described with respect to FIGS. 7-10. The detection process is the same as that for the 3-6-9 coding pattern. The difference is that the filter used has a narrower bandwidth (which can be seen from FIG. 8B, the filtered spectrum of the signal). This makes sense because the highest frequency in this pattern is lower than that in the 3-6-9 coding pattern.

Figure 7A:
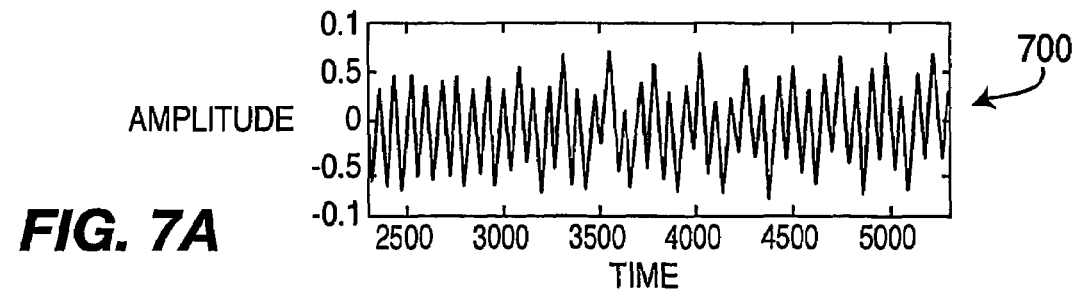
FIGS. 7A and 7B are diagram respectively illustrating the acquired 4-6-8 data waveform 700 and the corresponding spectrum 750, according to an illustrative embodiment of the present invention.
Figure 7B:
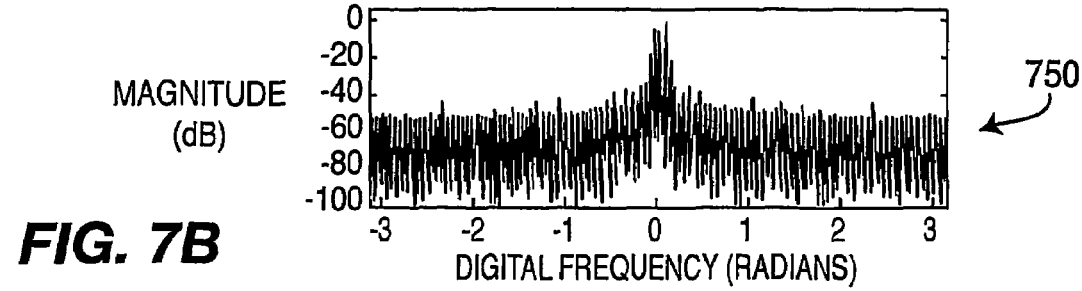

FIGS. 7A and 7B are diagram respectively illustrating the acquired 4-6-8 data waveform 700 and the corresponding spectrum 750, according to an illustrative embodiment of the present invention. In this 4-6-8-coding pattern, we found 3 errors in the decoded signal. The Symbol Error Rate is defined as follows:

(SER)=(number of Symbols in Error)/(Total Number of Symbols), where one symbol represents one transition in the given pattern. This corresponds to an SER as follows:

$$SER=3 \text{ (errors)}/650 \text{ (compared symbols)}=4.6*10^{-3}$$

Note that the error floor is $1*10^{-3}$. Further note that one symbol error causes the current bit and the adjacent bit to be in error. Therefore, one bit error translates into at least two bit errors. Hence, the above SER can be converted to Bit Error Rate (BER) as follows:

$$BER=[3(symbols)*2(error\ bits/symbol)]/(650* 6\ bits)= 1.5*10^{-}$$

Note that the total number of symbols used in all test patterns is 680 symbols. These include 80 repetitions of 6T's and 200 repetitions of a certain pattern: 3-6-9, 4-6-8, or 5-6-7. Due to the data acquisition error and filtering error (edge of the filter), only 650 symbols are used for comparison when calculating symbol errors. Since the average symbol error is 6 bits/symbol, the total number of bits used in the test pattern is 680*6=4080 bits. Moreover, the number of bit used for calculating bit errors is 650*6=3900 bits.

Figure 8A:
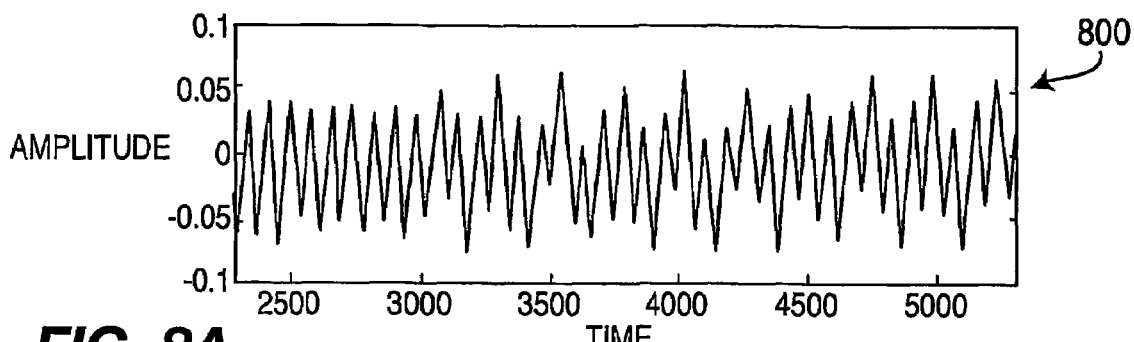
FIGS. 8A and 8B are diagrams respectively illustrating a filtered version 800 the acquired 4-6-8 data waveform 700 of FIG. 7A and the corresponding spectrum 850, according to an illustrative embodiment of the present invention.
Figure 8B:
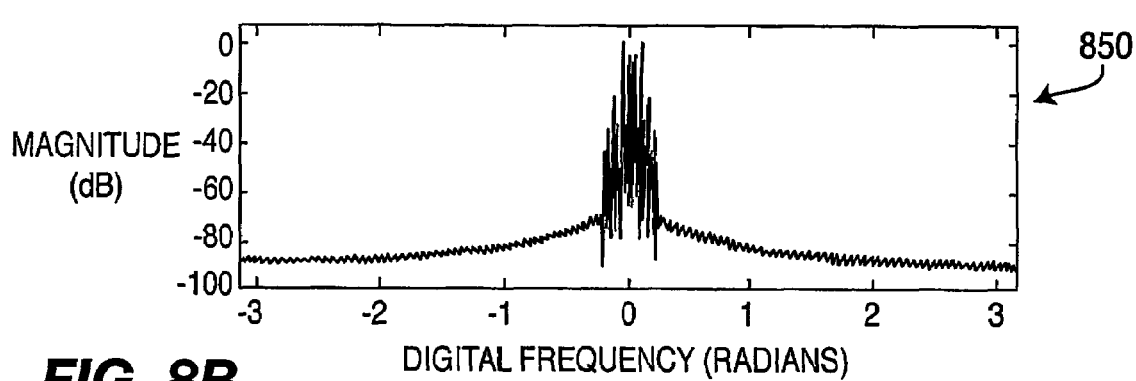

FIGS. 8A and 8B are diagrams respectively illustrating a filtered version 800 the acquired 4-6-8 data waveform 700 of FIG. 7A and the corresponding spectrum 850, according to an illustrative embodiment of the present invention. The waveform 800 shown in FIG. 8A is the signal 700 after processing by the low pass filter 110 and the non-linearity module 120 of FIG. 1.

Figure 9A:
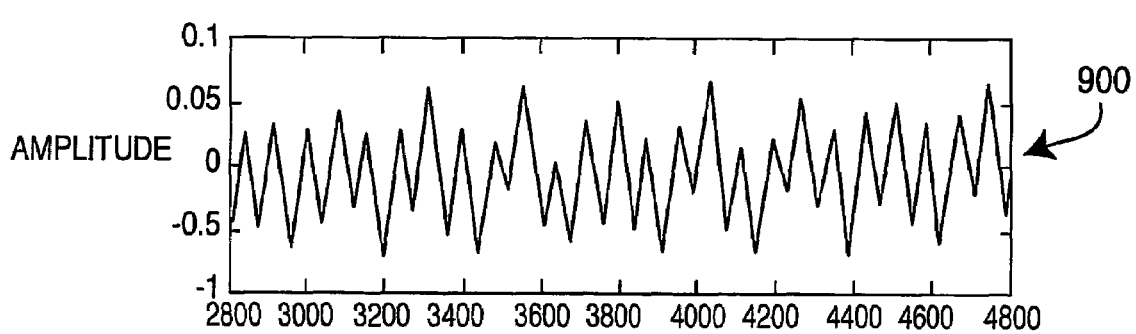
FIGS. 9A and 9B are diagrams respectively illustrating a jitter-eliminated and hard-limited version 900 of the filtered signal 800 of FIG. 8A and a jitter-eliminated and hard-limited version 950 of a peak detected signal, according to an illustrative embodiment of the present invention.
Figure 9B:
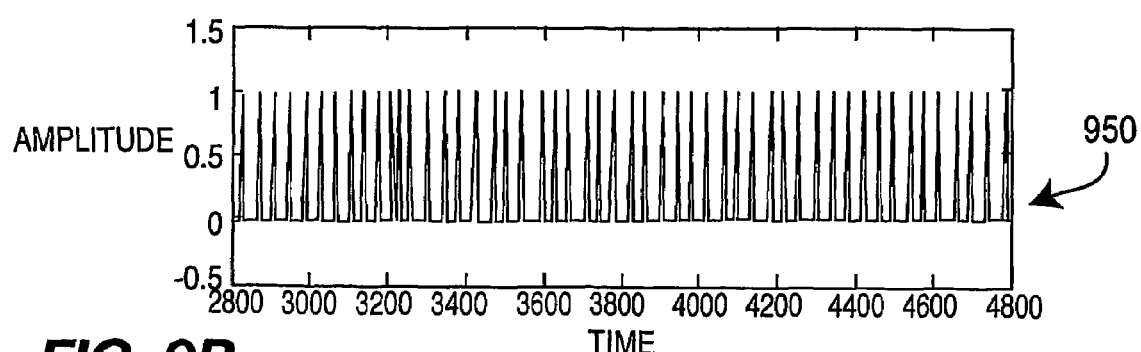

FIGS. 9A and 9B are diagrams respectively illustrating a jitter-eliminated and hard-limited version 900 of the filtered signal 800 of FIG. 8A and a jitter-eliminated and hard-limited version 950 of a peak detected signal, according to an illustrative embodiment of the present invention. The signals 900 and 950 have been processed by both the jitter eliminator 140 and the hard-limiter 150 of FIG. 1.

Figure 10A:
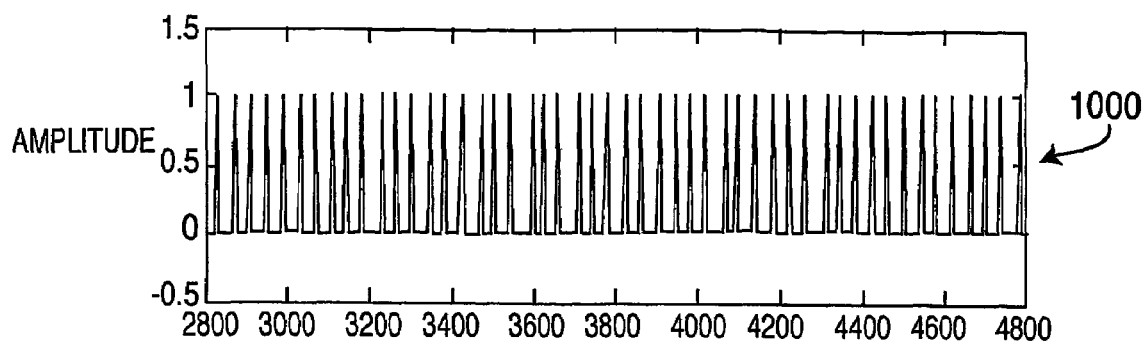
FIGS. 10A and 10B are diagrams respectfully illustrating a pulse-shaped version 1000 of the peak-detected signal and a pulsed-shaped version 1050 of the decoded signal, according to an illustrative embodiment of the present invention.
Figure 10B:
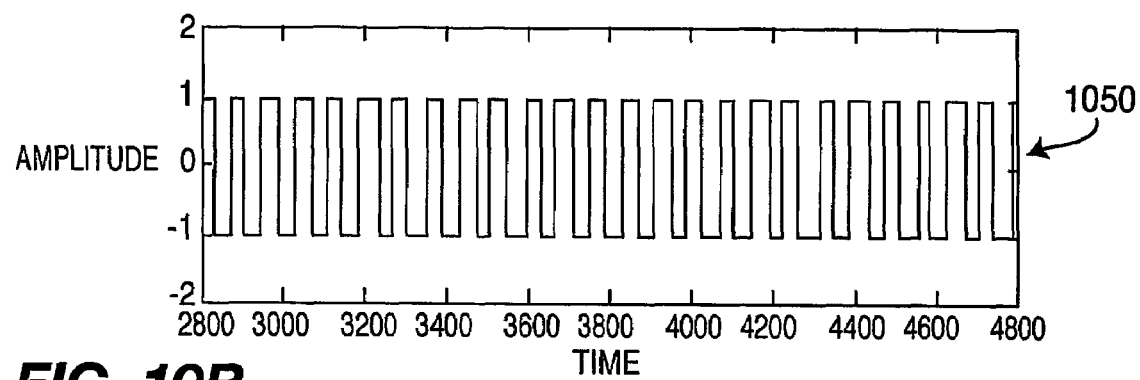

FIGS. 10A and 10B are diagrams respectfully illustrating a pulse-shaped version 1000 of the peak-detected signal and a pulsed-shaped version 1050 of the decoded signal, according to an illustrative embodiment of the present invention.

A description will now be given of the detection of the 5-6-7 coding pattern, according to an illustrative embodiment of the present invention. The results of the detection of the 5-6-7 coding pattern are shown and described with respect to FIGS. 11-14. The detection process of the 5-6-7 coding pattern is the same as that described above with respect to the other patterns.

$$SER=7(symbol\ errors)/(650\ symbols)=1.08*10^{-2}.$$

$$BER=14(error\ bits)/3900(bits)=3.6*10^{-3}.$$

Figure 11A:
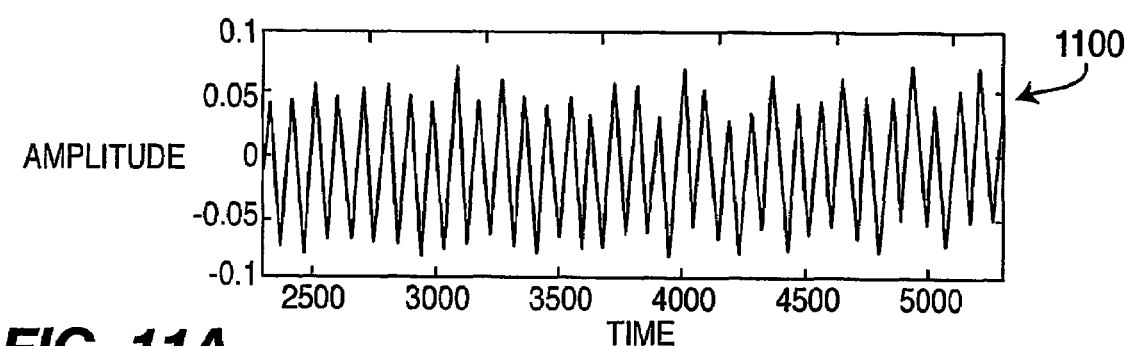
FIGS. 11A and 11B are diagram respectively illustrating the acquired 5-6-7 data waveform 1100 and the corresponding spectrum 1150, according to an illustrative embodiment of the present invention.
Figure 11B:
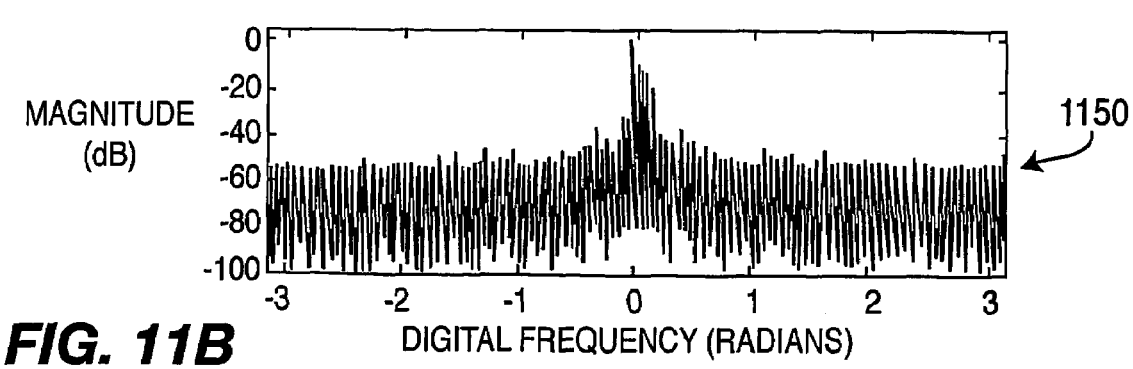

FIGS. 11A and 11B are diagram respectively illustrating the acquired 5-6-7 data waveform 1100 and the corresponding spectrum 1150, according to an illustrative embodiment of the present invention.

Figure 12A:
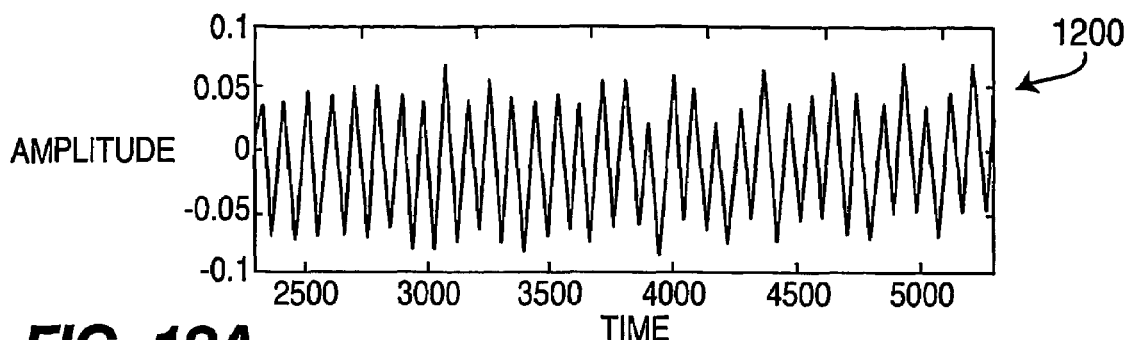
FIGS. 12A and 12B are diagrams respectively illustrating a filtered version 1200 of the acquired data waveform 1100 of FIG. 11A and the corresponding spectrum 1250, according to an illustrative embodiment of the present invention.
Figure 12B:
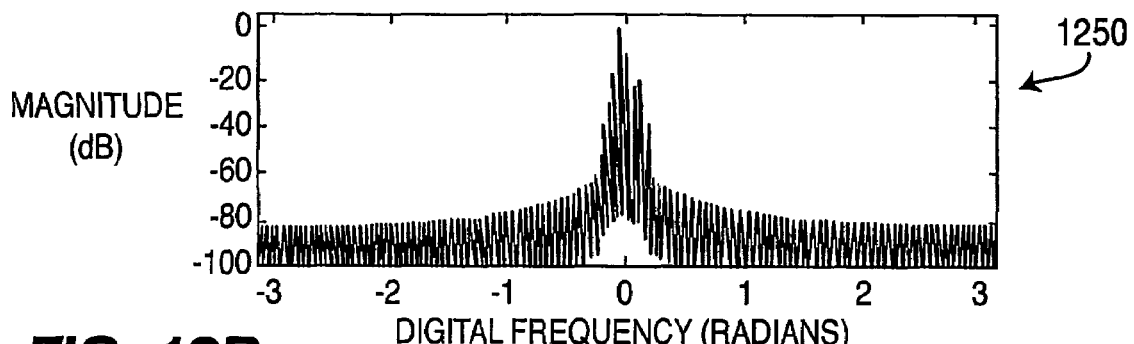

FIGS. 12A and 12B are diagrams respectively illustrating a filtered version 1200 of the acquired data waveform 1100 of FIG. 11A and the corresponding spectrum 1250, according to an illustrative embodiment of the present invention. The waveform shown in FIG. 12A is the signal 1100 after processing by the low pass filter 110 and the non-linearity module 120 of FIG. 1.

Figure 13A:
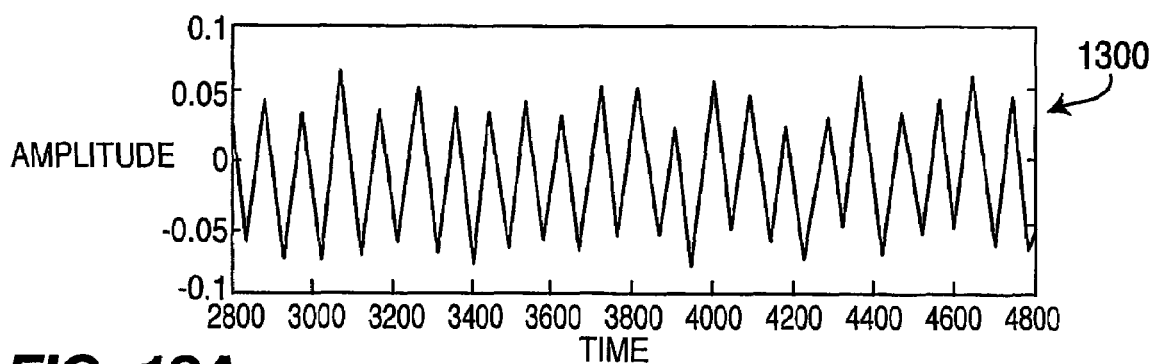
FIGS. 13A and 13B are diagrams respectively illustrating a jitter-eliminated and hard-limited version 1300 of the filtered signal 1200 of FIG. 12A and a jitter-eliminated and hard-limited version 1350 of a peak detected signal, according to an illustrative embodiment of the present invention.
Figure 13B:
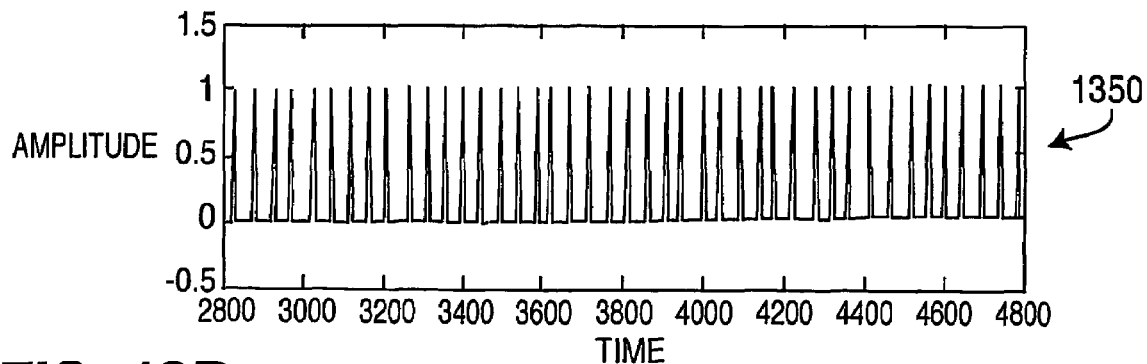

FIGS. 13A and 13B are diagrams respectively illustrating a jitter-eliminated and hard-limited version 1300 of the filtered signal 1200 of FIG. 12A and a jitter-eliminated and hard-limited version 1350 of a peak detected signal, according to an illustrative embodiment of the present invention.

The signals 1300 and 1350 have been processed by both the jitter eliminator 140 and the hard-limiter 150 of FIG. 1.

Figure 14A:
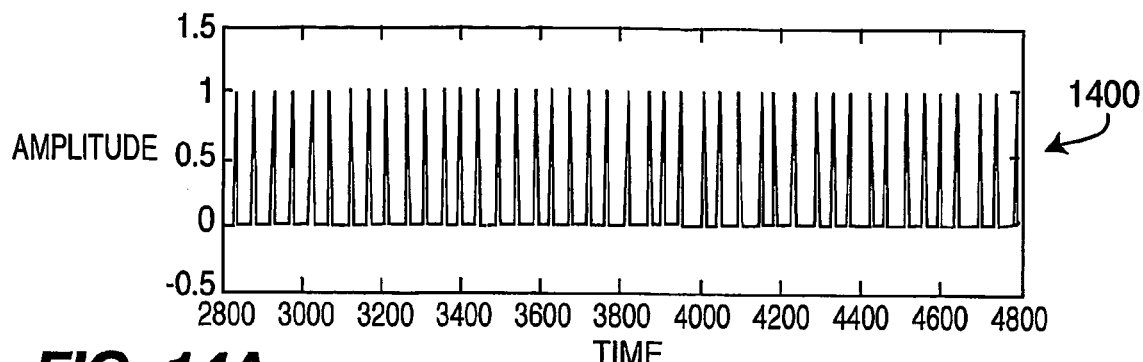
FIGS. 14A and 14B are diagrams respectfully illustrating a pulse-shaped version 1400 of the peak-detected signal and a pulsed-shaped version 1450 of the decoded signal, according to an illustrative embodiment of the present invention.
Figure 14B:
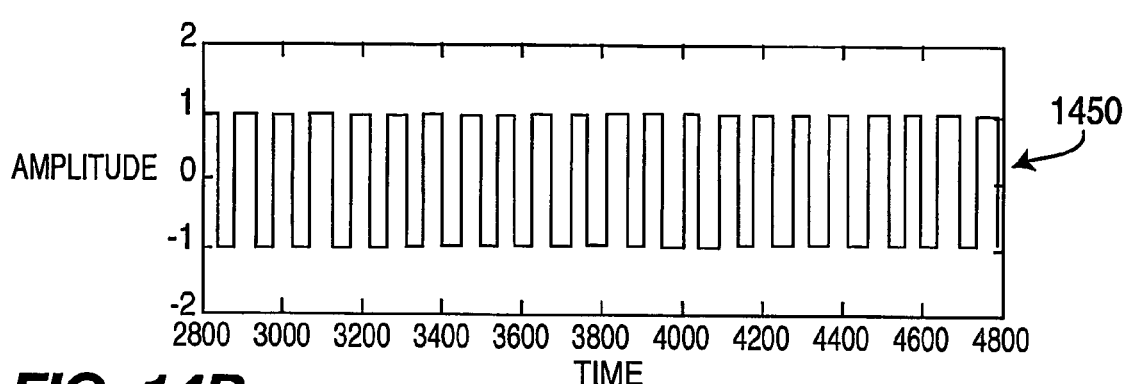

FIGS. 14A and 14B are diagrams respectfully illustrating a pulse-shaped version 1400 of the peak-detected signal and a pulsed-shaped version 1450 of the decoded signal, according to an illustrative embodiment of the present invention.

The above tests have established the capability to detect three distinctive width symbols at a 50 Mega Symbol rate on a HDD, using VAC coding. In the tests that were conducted, a low to high transition was given a width of "3T", a high to low transition was given a width of "9T", and a no change was assigned a "6T" width. The data was clocked at 300 MHz to realize a 50 Mega Symbols per second (50 Mbps) rate. Going forward, there are three approaches that can be taken to increase the data rate to 100 Mbps and beyond.

In the first approach, the clocking rate is retained at 300 MHz, but new encoding rules are adopted as follows. Group the raw data into two bit bytes. There are 4 possible combinations; 00, 01, 10 and 11. Assign the following widths to each of the 2 bit bytes from the original raw data stream;

01 - - - "3T"

10 - - - "9T"

A "6T" after "3T" indicates "11" and a "5T" after "3T" indicates a "00" in the raw data stream. A "6T" after "9T" indicates a "00" and a "5T" after "9T" indicated an "11" in the raw data stream. It follows that with the clock speed at 300 MHz, our symbol rate will be 50 MegaSymbols/sec. However, for every width detected, 2 bits of raw data is decoded. Hence, the aggregate raw data rate is now 50 Mega Symbols×2 bits=100 Mbps.

In terms of transition density, the current limit of 500 kbpi is not exceeded.

In terms of the time duration (distance on the disc), the following comparison can be made. The average Symbol width of "T" in the case of VAC with the 3-5/6-9scheme is (3T+9T)/2=6T. With a 300 MHz clocking rate, T=3.3 nsecs. Hence the average time duration between transitions on the disc is 6×3.333 nsecs=19.99 nsecs. Since each symbol represents 2 bits of raw data, we output 2 bits of raw data at an average interval of 19.99 nsecs, which is very close to the PRML system at 100 Mbps, where each bit of raw data occupies 10 nsecs.

In the second approach to increasing the data rate to 100 Mbps and beyond, the clocking rate is maintained at 300 MHz, but new encoding rules as adapted as follows. Encode the input raw data stream with a 2/3(1,α) code. There will be three 2-bit words and four 4-bit words possible in this encoding process. The possible word combinations and widths are shown in Table 1.

TABLE 1

| Data A | Width |
|---|---|
| 00 | 3 T |
| 01 | 6 T |
| 10 | 9 T |
| 1100 | 4 T |
| 1101 | 5 T |
| 1110 | 7 T |
| 1111 | 8 T |

It follows that with a clock speed of 300 MHz, our symbol rate is still 50 Mega Symbols/sec. However for every width detected, 2-4 bits of raw data is decoded. In terms of transition density, the current limit at 500 kbpi is not exceeded as the average symbol width of "T" in the case of VAC is (3T+9T)/2=6T, which corresponds to a 50 MSymbol rate.

In terms of the time duration (distance on the disc), the following comparison can be made. With a 300 MHz clocking rate, T=3.33 nsecs. Assume we want to send all the 22 bits of data in column A. The corresponding widths total 42T, and the total time duration is 42×3.3 nsecs=140 nsecs. A PRML based system at 100 Mbps would need 22×10 nsecs=220 necs worth of time to send the same 22 bits of information. A VAC based system provides an improvement of 220/140=1.57 times over a PRML system at 100 Mbps.

In the third approach to increasing the data rate to 100 Mbps and beyond, the clocking rate is increased to 600 MHz, but new encoding rules are adopted as follows. Group the raw data into 4 bit bytes. There are 16 possible combinations, i.e., 8 unique patterns and 8 complementary patterns. The following widths are assigned to each of the 4 bit bytes from the original raw data stream as shown in Table 2.

TABLE 2

| Unique Sequence A | Width | Complementary sequence B | Width |
|---|---|---|---|
| 0000 | 8 T | 1111 | −8 T |
| 0001 | 9 T | 1110 | −9 T |
| 0010 | 10 T | 1101 | −10 T |
| 0011 | 11 T | 1100 | −11 T |
| 0100 | 13 T | 1011 | −13 T |
| 0101 | 14 T | 1010 | −14 T |
| 0110 | 15 T | 1001 | −15 T |
| 0111 | 16 T | 1000 | −16 T |

A "12T" after any sequence in column A or B indicates a repeat pattern of the preceding 4-bit block. Sequences can be selected from either column A or B. However, if two or more 4 bit words are from the same column A, a "1" needs to be added in front of after every 2nd, 4th, 6th or 8th selection in the same column and the resulting 4 bit word needs to be assigned a width. The addition of "1" moves the 4 bit word from Column A to Column B where symbols have negative polarity. This is done to ensure alternating polarity between the adjacent symbols and also to ensure proper polarity for the symbols. In a similar manner, if we need to select consecutive sequences in Column B, then alternately a "0" must be added to the 2nd, 4th, 6th and 8th selections in the same column. The addition of a "0" puts the word into column A, where symbols have a positive polarity. At the end of the data transmission, a look-up table indicating the insertion points of additional "1"s and "0"s are sent, which will be used by the decoder to arrange the bits in order.

In terms of transition density, the symbol rate can be observed to be within the current flux reversal limit at 500 kbpi. In terms of the time duration (distance on the disc), the following comparison can be made. The average Symbol width of "T" in the case of VAC is (8T+16T)/2=12T. With a 600 MHz clocking rate, T=1.6666 nsecs. Hence, the average time duration between transitions on the disc is 12×1.6666 nsecs=19.999 nsecs. Since each symbol represents 4 bits of raw data, we output 4 bits of raw data at an average interval of 19.99 nsecs, which is 2× times the rate of a PRML system at 100 Mbps. VAC with the above architecture is capable of supporting data rates of 200 Mbps (50 Msymbols/sec×4 bits).

The successful detection of the sequences 3-6-9, 5-6-7, and 4-6-8 establishes the three different ways VAC can work on an HDD. The 3-6-9 detection had the best BER performance. The detection of the 5-6-7 sequence allows us to determine the closest spacing that pulses could be packed, without detrimental effects on the detection. Post-processing of VAC signals are performed with an architecture having no Analog-to-Digital Converters (ADCs), validating a power efficient detection scheme.

Figure 15:
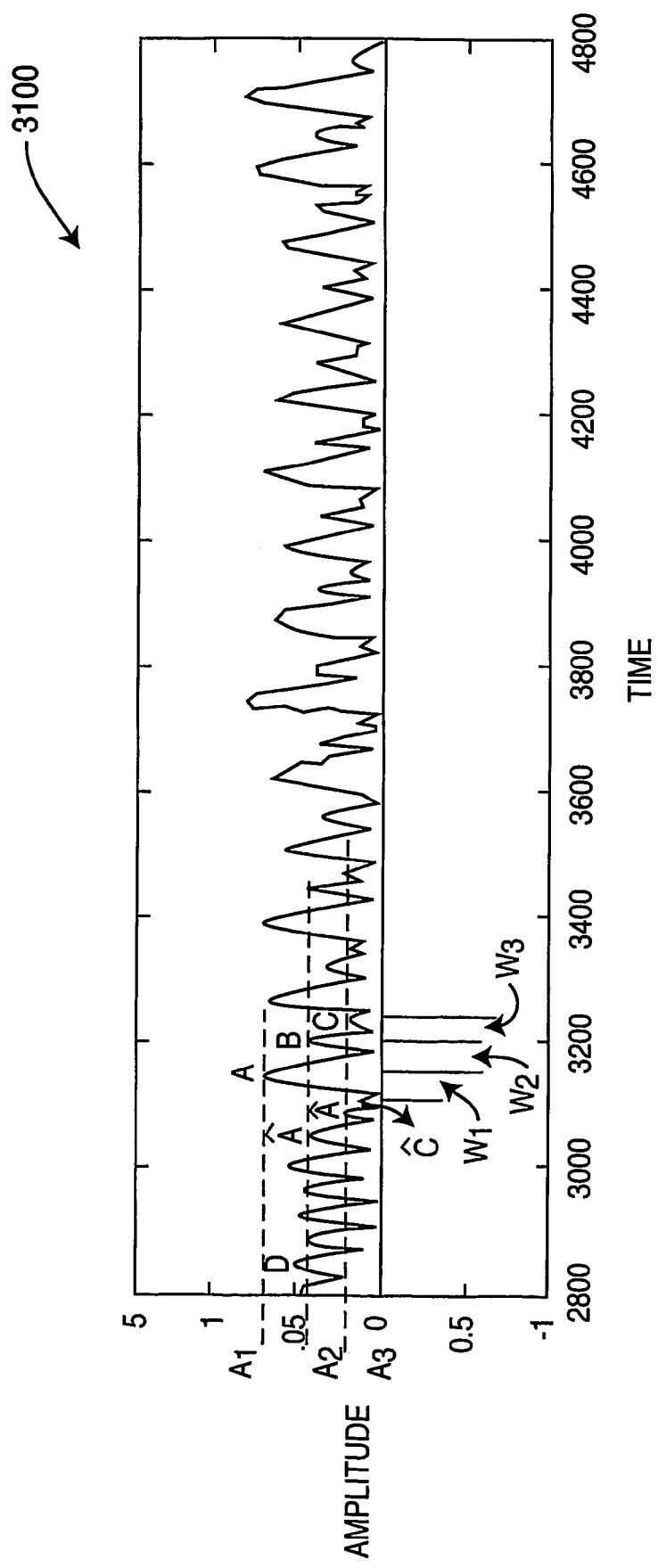
FIG. 15 is a diagram illustrating a plot of a decoded waveform 3100, according to an illustrative embodiment of the present invention.

FIG. 15 is a diagram illustrating a plot of a decoded waveform 3100, according to an illustrative embodiment of the present invention. In the plot, the X-axis represents the elapsed time and Y-axis represents the amplitude of the detected waveform. In the simulation to which the plot corresponds, a 3-6-9 waveform was used. The section marked "D" is comprised of all "6" waveforms. Prior to introducing the 3-6-9 waveform, around 500 bits of all "6" is sent in order to stabilize the DC offsets. The 3-6-9 waveform clearly shows an amplitude variation and this is due to the destructive influence of ISI.

In the detection of VAC demodulated signals, the detected signals are subjected to full wave rectification, whereby the negative peaks are folded over. The width W1 between C^ and A (a 9 to 3 transition) signifies a width of W1. The ISI effects are not as pronounced for the peak A and hence it has an amplitude which is labeled A1. The next width W2 is the peak separation between A and B (a 3 to 6 transition). The ISI effects on B make its amplitude smaller than A1. The amplitude of B is designated as A2. Similarly, the transition between B and C produces a width W3. The amplitude of C is less than B and is designated as A3.

It can be easily surmised that by using a PRML type of detector, we have combinations of 3 amplitudes and 3 widths to make a correct decision. Error correction is easy, as we do not even have to detect C in the assigned slot, as the amplitude is so small. If no amplitude is sensed, it can automatically be concluded to be a "C".

The process uses a combination of amplitude and width to correctly decode the symbol. One could also look at amplitude alone and decode the expected width. Since in the demodulation process of VAC, the symbol widths are critical in determining the decoded data, the amplitude information can be directly mapped to give the demodulated VAC data stream.

Figure 16:
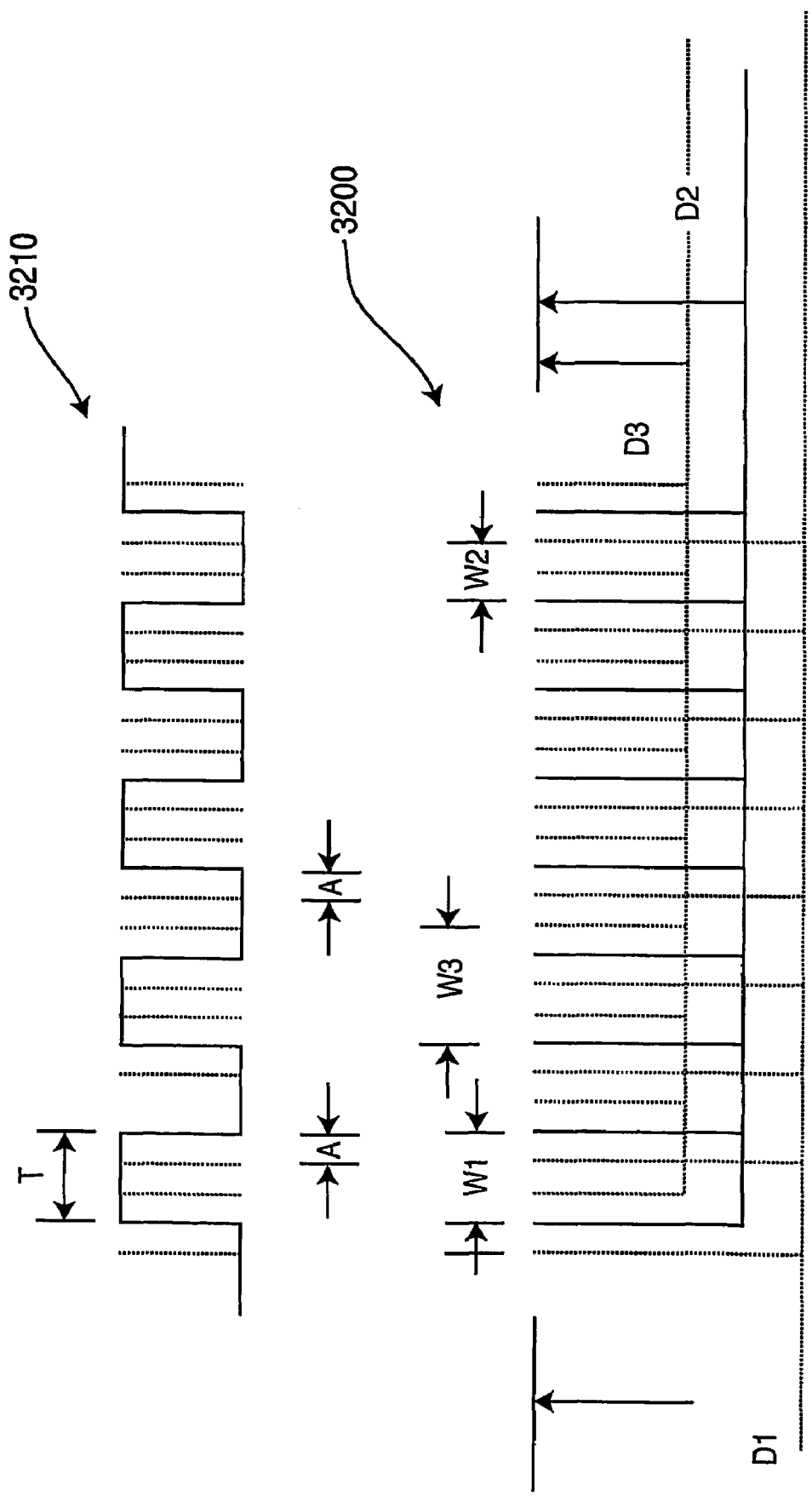
FIG. 16, which is a diagram illustrating various encoding combinations 3200 for a waveform 3210, according to an illustrative embodiment of the present invention.

Of particular significance is the ability to synthesize varying amplitudes at the receiver by manipulation of the encoded data stream at the transmitter. When applied to optical recording media, the widths W1, W2 and W3 can be made to have various pit depths by varying the intensity of the lasing device. Let the pit depths be designated as D1, D2 and D3. We can now have 9 combinations: W1 with D1, D2, and D3; W2 with D1, D2, and D3; W3 with D1, D2, and D3. These combinations are shown in FIG. 16, which is a diagram illustrating various encoding combinations 3200 for a waveform 3210, according to an illustrative embodiment of the present invention. Thus, by choosing a combination of W and D, we can encode the incoming data stream at 3 bits/symbol. Extrapolating this result, we can use this method to store 15 Gb information on a standard DVD disc than can normally hold only 4.7 Gb, without the need to go to a blue laser. By including more widths and depths, a higher level of bandwidth efficiency is possible.

To satisfy the storage capacity requirements of HDTV, some have proposed dual-layer storage on both sides of the optical disc. But such a tactic would increase manufacturing costs significantly, while doing nothing to bolster data transfer rates.

The present invention provides a novel optical encoding technique, referred to herein as pit-depth modulation, that supports HDTV using single-layer recording on just one side of a disk even when using red-laser technology. Moreover, transfer rates are directly proportional to storage capacity, and quite significantly, the new encoding technique can be readily incorporated into existing CD/DVD production lines.

Many proposals for future DVD systems look to the blue laser as the enabling technology for high density. However, manufacturing tolerances for 120-mm DVD disks are already extremely tight. Blue lasers will surely compound matters and may necessitate new mastering and duplication equipment to meet acceptable quality standards. Even this new capital investment may not be sufficient to meet HDTV performance and capacity requirements The capacity of the DVD drive increases by a factor proportional to the reduction in laser spot size. Thus, the long-sought-after blue laser, with its short 410 nm wavelength, promises to increase the storage capacity by 2.4 times over similar DVD drives employing 635 nm wavelength red lasers (635 nm/410 nm), which means that a DVD drive, even one with a blue laser inside, can not satisfy the storage requirements of HDTV (at least not with a single-sided, single layered disk). Assuming blue lasers were currently available, based on present DVD specs, it would take two layers to satisfy HDTV requirements; further, use of an ordinary red laser, a double-sided, four-layered disk would be required. Both of these solutions have drawbacks for end-users and manufacturers. Dual-sided disks have to be flipped over to accommodate a feature film. Dual-layer encoding requires an additional process step, adding significantly to the manufacturing cycle time.

The limitations of current read-only optical systems are a result of the pit-length encoding method in which streams of data are pressed into "pits" of variable lengths and fixed depths. Data is read using photoelectric cells, which detect the binary output of either a "pit" or "land" area. Pit-depth modulation, in contrast, is essentially a three-dimensional approach to data-stream recording: the depth of the data pit varies, while the length is fixed. The photocell detects the variable pit depths and produces a graded, rather than binary, output. An optical drive employing pit-depth modulation can support two-plus hours of high-resolution video, or at least 15 GB of data, while meeting the data transfer requirements of 19 Mbit/sec as defined in the Grand Alliance proposal for HDTV.

Moreover, this specification can be met using current red laser (635 nm/650 nm) diodes. Of course, shorter wavelength lasers would provide additional benefits but they are not a prerequisite for production of an HDTV-ready drive employing this encoding technology. A significant point, especially for manufacturers who have invested in DVD production equipment, is that the new encoding technology requires only relatively minor changes to mastering benches. Also, existing replication gear can be used to produce the new media within accepted cycle times.

Based on laser and track-pitch specifications of current DVD drives, optical drives using fixed-length, variable-depth data pits can easily satisfy HDTV requirements. Data capacity and transfer speed can be enhanced further by modulating pit depths more finely and by shortening the lengths of the individual pits. The former can be achieved by improving the mastering process.

In conventional optical systems, streams of data are pressed onto disks in variable-length, fixed-depth pits (top). In the method according to the present invention, pit depth varies within a fixed pit length.

Current CD and DVD players cannot discriminate among pits deeper than a quarter-wavelength, because the reader response is sinusoidal in nature; as pit depth increases from zero to quarter-wavelength, the light reflected from the disk decreases from a maximum to minimum. Thus, an alternate readout method is needed, one that does not bottom out when pit depths exceed a quarter-wavelength.

Pits are usually shortened to improve performance. However, if the pits are too short, signals from neighboring pits will interfere with each other. This intersymbol interference can be pre-compensated for in the mastering process through slight adjustments to pit depth. Intersymbol interference stems from the pits being smaller than the laser reading spot: when the laser spot is centered over a pit, the diffracted light is affected not only by the pit of interest, but by the adjacent neighbors as well. By slightly adjusting each pit up or down from its nominal depth (the amount and direction is dependent on the depths of the neighboring pits), the reader can be made to produce the same electrical response for a particular depth pit that is independent of its neighbors. In practice, each reader head design varies slightly in the nature of its laser spot, so compensation for intersymbol interference will need to occur in both the mastering and readout stage (i.e., pre- and post-compensation). Post-compensation can be accomplished in the disk reader by using digital signal processing techniques to properly filter or equalize the data signal based on knowledge of intersymbol interference from varying pit depths.

Figure 17:
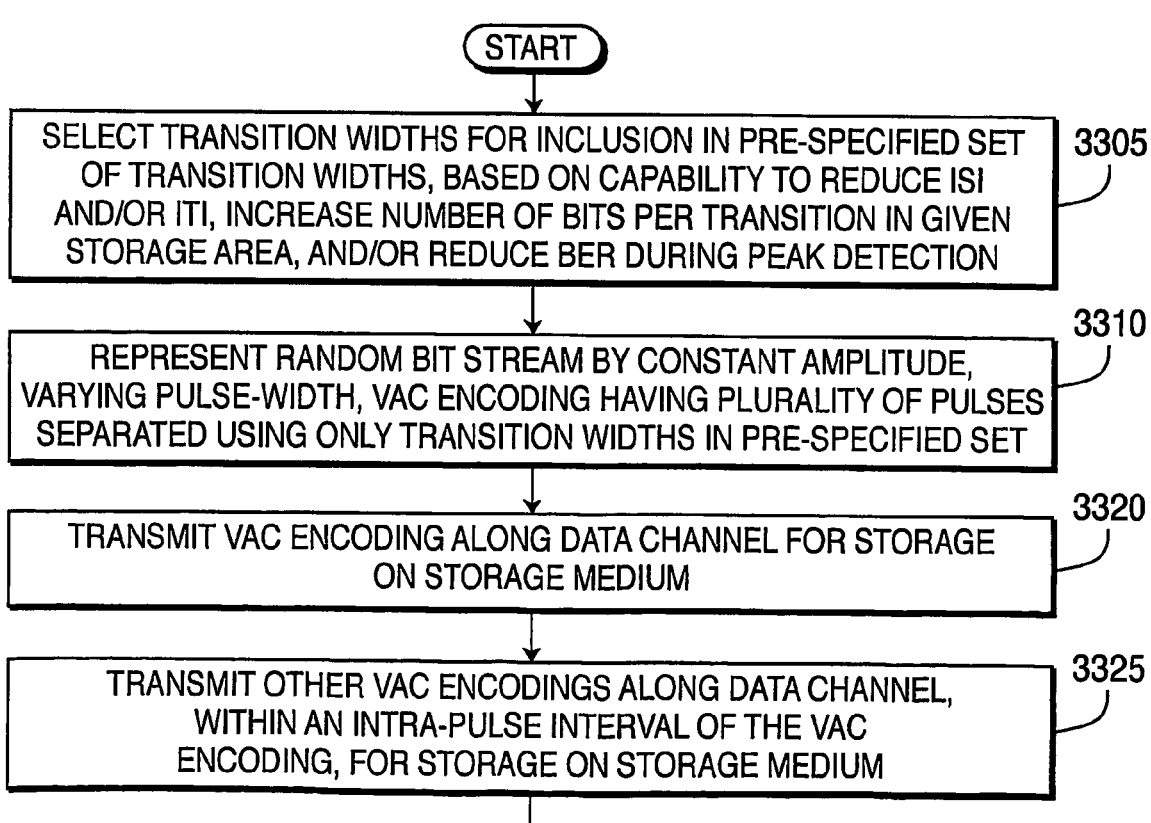
FIG. 17 is a flow diagram illustrating a method for storing a random bit-stream on a storage medium, according to an illustrative embodiment of the present invention.

FIG. 17 is a flow diagram illustrating a method for storing a random bit-stream on a storage medium, according to an illustrative embodiment of the present invention.

Transition widths, for inclusion in a pre-specified set of transition widths, are selected based on a capability to reduce Inter-Symbol Interference (ISI) and/or Inter-Track Interference (ITI) during a read operation of a VAC encoding from the storage medium, to increase a number of bits per transition in a given storage area on the storage medium, and/or to reduce a Bit Error Rate (BER) of the VAC encoding during a peak detection operation performed on the VAC encoding (step 3305).

The random bit stream is represented by a constant amplitude, varying pulse-width, VAC encoding having a plurality of pulses that are separated using only the transition widths included in the pre-specified set of transition widths (step 3310).

The VAC encoding is transmitted along a data channel for storage on the storage medium (step 3320). It is to be appreciated that step 3320 may include the step of transmitting other VAC encodings along the data channel, within an intra-pulse interval of the VAC encoding, for storage on the storage medium (step 3325).

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

The invention claimed is:

1. A method for encoding a random bit stream in two-dimensions for storage on a storage medium, comprising the steps of:
   encoding (3310) the random bit stream using Variable Aperture Coding (VAC) so as to generate a constant amplitude, varying pulse-width, VAC encoding that represents the random bit stream by a plurality of pulses separated using only transition widths included in a pre-specified set of transition widths.

2. The method of claim 1, wherein each of the transition widths in the predetermined set specify a different number of zeros between adjacent ones.

3. The method of claim 2, wherein the transition widths in the pre-specified set consist of one of a first group, a second group, and a third group of transition widths, the first group consisting of three zeros, six zeros, and nine zeros, the second group consisting of five zeros, six zeros, and seven zeros, and the third group consisting of four zeros, six zeros, and eight zeros.

4. The method of claim 1, further comprising the steps of:
   transmitting (3320) the VAC encoding along a data channel for storage on the storage medium; and
   transmitting (3325) other VAC encodings along the data channel, within an intra-pulse interval of the VAC encoding, for storage on the storage medium.

5. The method of claim 4, wherein the VAC encoding and the other VAC encodings are orthogonal with respect to each other.

6. The method of claim 1, further comprising the step of selecting (3305) the transition widths included in the pre-specified set of transition widths based on a capability to reduce at least one of Inter-Symbol Interference (ISI) and Inter-Track Interference (ITI) during a read operation of the VAC encoding from the storage medium.

7. The method of claim 1, further comprising the step of selecting (3305) the transition widths included in the pre-specified set of transition widths so as to increase a number of bits per transition in a given storage area on the storage medium.

8. The method of claim 1, further comprising the step of selecting (3305) the transition widths included in the pre-specified set of transitions so as to decrease a Bit Error Rate (BER) of the VAC encoding during a peak detection operation performed on the VAC encoding.

9. A method for storing a random bit-stream on a storage medium, comprising the steps of:
   representing (3310) the random bit stream by a constant amplitude, varying pulse-width, VAC encoding having a plurality of pulses that are separated using only transition widths included in a pre-specified set of transition widths; and
   transmitting (3320) the VAC encoding along a data channel for storage on the storage medium.

10. The method of claim 9, wherein each of the transition widths in the predetermined set specify a different number of zeros between adjacent ones.

11. The method of claim 10, wherein the transition widths in the pre-specified set consist of one of a first group, a second group, and a third group of transition widths, the first group consisting of three zeros, six zeros, and nine zeros, the second group consisting of five zeros, six zeros, and seven zeros, and the third group consisting of four zeros, six zeros, and eight zeros.

12. The method of claim 9, further comprising the step transmitting (3325) other VAC encodings along the data channel, within an intra-pulse interval of the VAC encoding, for storage on the storage medium.

13. The method of claim 12, wherein the VAC encoding and the other VAC encodings are orthogonal with respect to each other.

14. The method of claim 9, further comprising the step of selecting (3305) the transition widths included in the pre-specified set of transition widths based on a capability to reduce at least one of Inter-Symbol Interference (ISI) and Inter-Track Interference (ITI) during a read operation of the VAC encoding from the storage medium.

15. The method of claim 9, further comprising the step of selecting (3305) the transition widths included in the pre-specified set of transition widths so as to increase a number of bits per transition in a given storage area on the storage medium.

16. The method of claim 9, further comprising the step of selecting (3305) the transition widths included in the pre-specified set of transitions so as to decrease a Bit Error Rate (BER) of the VAC encoding during a peak detection operation performed on the VAC encoding.

* * * * *